(12) United States Patent
Zappala

(10) Patent No.: US 6,919,765 B2
(45) Date of Patent: Jul. 19, 2005

(54) AMPLIFIER LINEARIZATION BY PRE-DISTORTING A DECOMPOSED INPUT SIGNAL

(75) Inventor: Christopher F. Zappala, Annandale, NJ (US)

(73) Assignee: Andrew Corporation, Orland Park, IL (US)

( * ) Notice: Subject to any disclaimer, the term of this patent is extended or adjusted under 35 U.S.C. 154(b) by 40 days.

(21) Appl. No.: 10/646,058

(22) Filed: Aug. 22, 2003

(65) Prior Publication Data
US 2005/0040887 A1 Feb. 24, 2005

(51) Int. Cl.[7] .................................................. H03F 1/26
(52) U.S. Cl. ....................................... 330/149; 330/284
(58) Field of Search ................................. 330/149, 284, 330/151; 455/114; 325/296

(56) References Cited

U.S. PATENT DOCUMENTS

| | | | |
|---|---|---|---|
| 5,049,832 A | 9/1991 | Cavers | 330/149 |
| 5,912,588 A | 6/1999 | Nummila | 330/254 |
| 6,112,062 A * | 8/2000 | Hans et al. | 455/114.3 |
| 6,239,657 B1 | 5/2001 | Bauer | 330/149 |
| 6,498,529 B1 | 12/2002 | Kim et al. | 330/2 |
| 6,531,918 B1 * | 3/2003 | Posner et al. | 330/151 |
| 6,600,369 B2 * | 7/2003 | Mitzlaff | 330/149 |
| 6,757,338 B1 * | 6/2004 | Kim et al. | 375/296 |
| 2002/0050372 A1 | 5/2002 | Lee | 174/35 R |
| 2002/0190787 A1 | 12/2002 | Kim et al. | 330/2 |
| 2002/0191710 A1 | 12/2002 | Jeckeln et al. | 375/296 |
| 2002/0191711 A1 | 12/2002 | Weiss et al. | 375/296 |
| 2003/0035494 A1 | 2/2003 | Bauder et al. | 375/296 |

* cited by examiner

*Primary Examiner*—Patricia Nguyen
(74) *Attorney, Agent, or Firm*—Steve Mendelsohn

(57) ABSTRACT

A power amplifier's complex pre-distortion curve is generated by decomposing a representation of an input signal, processing the resulting decomposed signals using analog techniques, and performing signal re-composition. In one implementation, two different halves of a transfer function corresponding to the amplitude characteristics of the amplifier are separately modeled and then combined to generate a control signal used to control a voltage-controlled attenuator that attenuates the input signal, while two different halves of a transfer function corresponding to the amplifier's phase characteristics are separately modeled and then combined to generate a different control signal used to control a voltage-controlled phase shifter that adjusts the phase of the input signal. The resulting output signal corresponds to an amplitude-and-phase pre-distorted signal that can be applied to linearize a corresponding (high power) amplifier.

25 Claims, 7 Drawing Sheets

AM-AM CHARACTERISTIC

AM-PM CHARACTERISTIC

AMPLIFIER LINEARIZATION BY PRE-DISTORTING A DECOMPOSED INPUT SIGNAL

FIELD OF THE INVENTION

The present invention relates to signal processing, and, in particular, to techniques for linearizing amplifiers based on input signal pre-distortion.

BACKGROUND OF THE INVENTION

There are primarily two types of pre-distortion techniques used to linearize power amplifiers: digital and analog. Digital techniques typically use envelope detectors, analog-to-digital converters (ADCs), look-up-tables, digital-to-analog converters (DACs), and vector modulators to create the pre-distorted waveforms to be applied to the power amplifier. Within reason, a multitude of pre-distorted waveforms can be created with this type of technique. However, such digital techniques include an inherent throughput delay associated with the ADC, digital signal processing, and DAC circuits. Most of this delay is related to the clock speed of operation, since each of these circuits is typically associated with many clock cycles of delay. To fundamentally reduce the delay, the clock speed must be increased. Additionally, digital techniques usually require expensive ADC and DAC components in the signal processing chain.

Existing analog predistortion circuits generally have fundamental limitations, since precise amplitude/phase relationships are not easily derived. Most analog circuits used are diode-or transistor-based circuits that do not have independent gain and phase relationships or controls. This means that a particular non-linear element is used for pre-distortion and is merely an approximation to the ultimate desired transfer curve. For example, a particular non-linear element, e.g., a transistor, is used as the pre-distortion device. The device may be driven hard enough to create the desired amplitude compression that matches the power amplifier's compression curve. However, as the pre-distorter is driven hard, the phase also compresses, but to a degree that may or may not match the power amplifier's phase-compression curve, resulting in a mismatch between the pre-distorter and the power amplifier, reducing the effectiveness of the pre-distorter. If the phase does match, it is only under very unique conditions that might not apply to another power amplifier's transfer curve, producing repeatability problems. As a result, most analog pre-distorters produce inadequate approximations to the amplifier's compressive characteristics.

BRIEF DESCRIPTION OF THE DRAWINGS

Aspects, features, and advantages of the present invention will become more fully apparent from the following detailed description, the appended claims, and the accompanying drawings in which like reference numerals identify similar or identical elements.

FIG. 5 shows a schematic diagram of a non-linear circuit designed for second-quadrant operations, while

DETAILED DESCRIPTION

Figure 1:
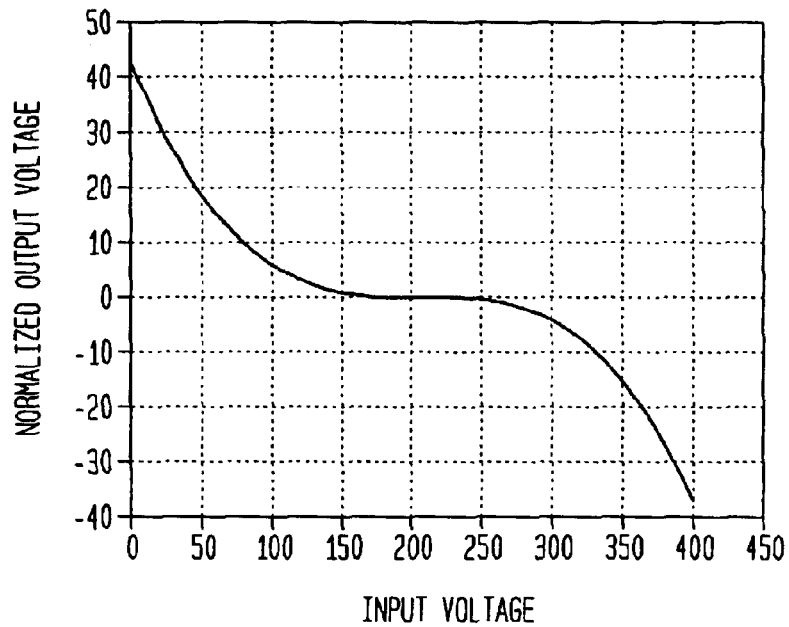
FIGS. 1 and 2 graphically represent typical amplitude and phase transfer curves, respectively, for an LDMOS-based class AB power amplifier.
Figure 2:
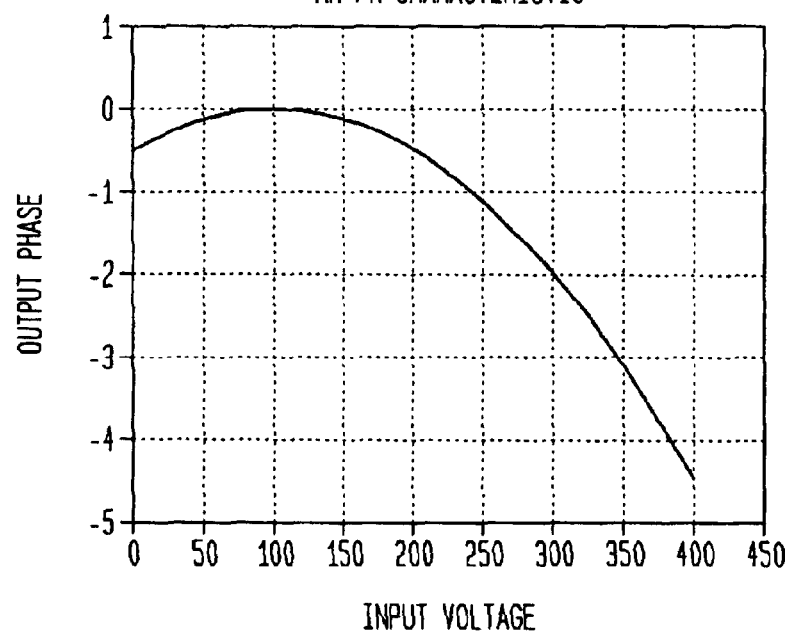

FIGS. 1 and 2 graphically represent typical amplitude and phase transfer curves, respectively, for an LDMOS-based class AB power amplifier. The normalized amplitude transfer curve of FIG. 1 nominally consists of two regions: a gain-expansion region generally at low input signal levels (e.g., less than an index of 200 in FIG. 1) and a gain-compression region generally during the signal peaks or at high input signal levels (e.g., greater than an index of 200). The amplitude curve shown in FIG. 1 is a 3rd-order transfer function, although typical power amplifiers can have higher-order transfer functions, particularly noticeable at the signal peaks. The phase curve shown in FIG. 2, on the other hand, is a 2nd-order polynomial, by way of example. The present invention is not limited by the order of the transfer curves and can be applied to a wide range of relationships exhibiting the general shape shown in these figures.

Amplitude Pre-Distortion

Figure 3:
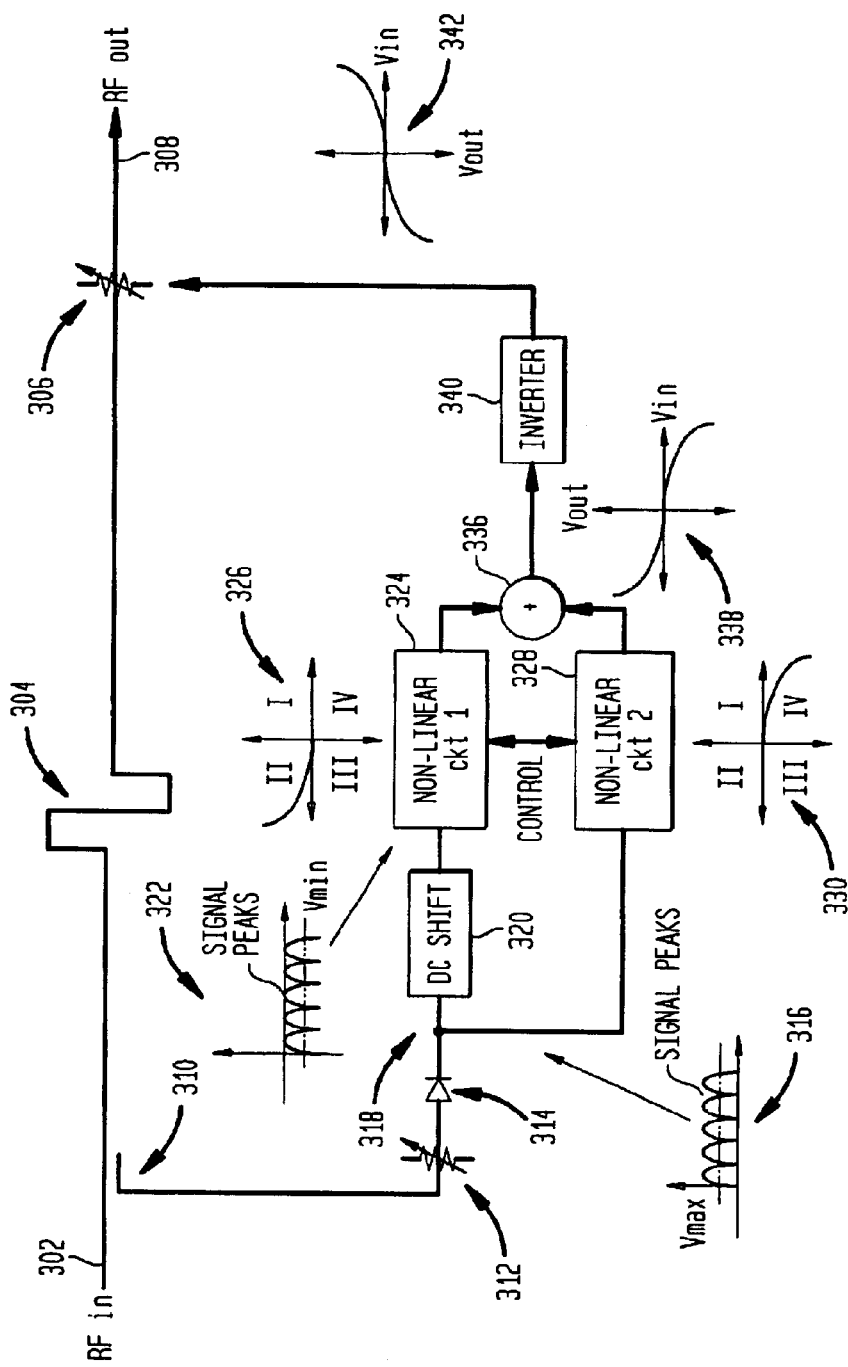
FIG. 3 shows a block diagram illustrating amplitude pre-distortion of an input signal, according to one embodiment of the present invention.

FIG. 3 shows a block diagram illustrating amplitude pre-distortion of an input signal, according to one embodiment of the present invention. As shown in FIG. 3, an analog RF input signal 302 is delayed by delay element 304 and then amplitude-adjusted at amplitude modulator 306 (e.g., a voltage-controlled variable attenuator) to generate an amplitude-distorted RF output signal 308.

A portion of RF input signal 302 is coupled off by tap 310, optionally attenuated at attenuator 312, and applied to diode 314, which functions as an envelope detector that provides an instantaneous measure or indication of the input signal amplitude. After the signal is envelope detected, the voltage waveform 316 is shown as a two-tone signal from 0 volts to Vmax, where 0 volts represents the signal-envelope nulls and Vmax represents the signal-envelope peaks.

This signal is split (318) into two copies, one of which is applied to DC-level-shifting circuit 320, nominally created using op-amps, which shifts the applied signal such that the signal-envelope peaks are referenced to 0 volts and the signal-envelope nulls are referenced to Vmin, as shown in voltage waveform 322. This DC-level-shifted signal is input to a first non-linear transfer function circuit 324, which operates in quadrant II in a Cartesian coordinate system, as shown in graph 326. The signal-envelope peaks (aligned with 0 volts in waveform 322) will be largely unaffected by circuit 324, since the output voltage in this region is near 0 volts. Only the large negative voltages, representing the signal-envelope nulls (or low power) will be affected by circuit 324. In this case, a positive voltage is produced for these lower signal levels.

The other copy of the envelope-detected signal is applied (without a DC shift) to a second non-linear transfer function circuit 328, which operates in quadrant IV, as shown in graph 330. Circuit 328 is designed such that low input voltages, near 0 volts, nominally produce 0-volt output voltages, while the larger input voltages produce negative output voltages at high levels, as shaped by the transfer function. Circuit 328, therefore, operates mainly on the signal-envelope peaks and leaves the signal-envelope nulls largely unaffected.

The signals produced by circuits 324 and 328 are combined at summation node 336 to create a complete transfer function, represented by waveform 338. In particular, circuits 324 and 328 are designed such that waveform 338 mimics the gain expansion and compression characteristics, respectively, of the amplifier (not shown) to be linearized. This combined signal is inverted by an inverting circuit 340 to change the sign of the transfer curve as represented by waveform 342.

The resulting inverted signal is used to control voltage-controlled attenuator 306, which adjusts the amplitude of the delayed RF input signal based on the input signal's instantaneous envelope value, where delay element 304 delays the main signal path an amount approximately equal to the analog signal processing delay of the control signal path. In the example shown in FIG. 3, lower control voltage values (e.g., less than zero) adjust the attenuator to yield higher attenuation in the main signal path, consistent with a signal decrease used to compensate for amplifier gain expansion. Conversely, higher control voltage levels (e.g., greater than zero) adjust the attenuator to yield lower attenuation in the main signal path, consistent with a signal boost used to compensate for amplifier gain compression.

FIG. 3 indicates control signals being applied to non-linear circuits 324 and 328. These control signals are intended to represent the performance of adaptation on the circuits' transfer curves to compensate for the effects of time, temperature, aging, and the like.

Phase Pre-Distortion

Figure 4:
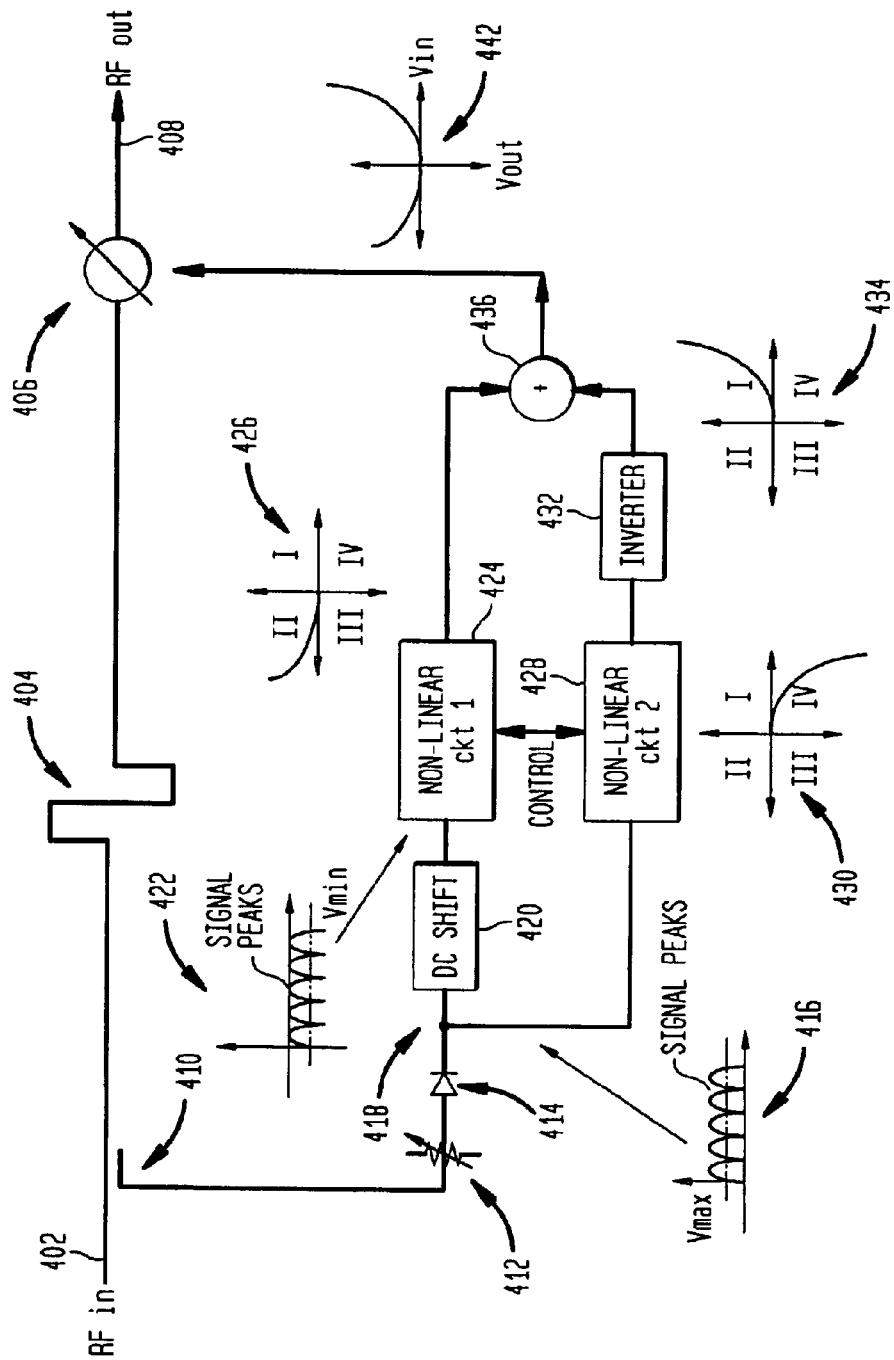
FIG. 4 shows a block diagram illustrating phase pre-distortion of an input signal, according to one embodiment of the present invention.

FIG. 4 shows a block diagram illustrating phase pre-distortion of an input signal, according to one embodiment of the present invention. The processing of FIG. 4 is analogous to that of FIG. 3, except that the analog circuits are designed to generate a combined transfer function that models the phase characteristics of the amplifier to be linearized rather than the amplifier's gain characteristics. In particular, as shown in FIG. 4, an analog RF input signal 402 is delayed by delay element 404 and then phase-adjusted at phase modulator 406 (e.g., a voltage-controlled phase shifter) to generate a phase-distorted RF output signal 408.

A portion of RF input signal 402 is coupled off by tap 410, optionally attenuated at attenuator 412, and applied to diode 414, which functions as an envelope detector. After the signal is envelope detected, the voltage waveform 416 is shown as a two-tone signal from 0 volts to Vmax, where 0 volts represents the signal-envelope nulls and Vmax represents the signal-envelope peaks.

This signal is split (418) into two copies, one of which is applied to DC-level-shifting circuit 420, which shifts the applied signal such that the signal-envelope peaks are referenced to 0 volts and the signal-envelope nulls are referenced to Vmin, as shown in voltage waveform 422. This DC-level-shifted signal is input to a first non-linear transfer function circuit 424, which operates in quadrant II, as shown in graph 426. The signal-envelope peaks (aligned with 0 volts in waveform 422) will be largely unaffected by circuit 424, since the output voltage in this region is near 0 volts. Only the large negative voltages, representing the signal-envelope nulls (or low power) will be affected by circuit 424. In this case, a positive voltage is produced for these lower signal levels.

The other copy of the envelope-detected signal is applied (without a DC shift) to a second non-linear transfer function circuit 428, which operates in quadrant IV, as shown in graph 430. Circuit 428 is designed such that low input voltages, near 0 volts, nominally produce 0-volt output voltages, while the larger input voltages produce negative output voltages at high levels, as shaped by the transfer function. Circuit 428, therefore, operates mainly on the signal-envelope peaks and leaves the signal-envelope nulls largely unaffected. The output from circuit 428 is inverted by inverting circuit 432 to generate waveform 434.

The signals produced by circuit 424 and inverter 432 are combined at summation node 436 to create a complete transfer function, represented by waveform 442, where circuits 424 and 428 are designed such that waveform 442 mimics the phase characteristics of the amplifier (not shown) to be linearized. This combined signal is used to control voltage-controlled phase shifter 406, which adjusts the phase of the delayed RF input signal based on the input signal's instantaneous envelope value, where delay element 404 delays the main signal path an amount approximately equal to the analog signal processing delay of the control signal path. In the example shown in FIG. 4, increasing control voltage magnitude (i.e., on either side of zero) corresponds to increased insertion phase in the main signal path. A phase pre-distortion of opposite signal could be handled using an inverting op-amp circuit in the control signal path.

As in FIG. 3, the control signals shown in FIG. 4 represent the performance of adaptation on the circuits' transfer curves to compensate for the effects of time, temperature, aging, and the like.

Combined Amplitude and Phase Pre-Distortion

Depending on the implementation, the amplitude and phase pre-distortion circuits of FIGS. C and D can be combined either in series or in parallel to form a single complex amplitude-and-phase pre-distortion circuit that can be (i) relatively low in throughput delay, (ii) implemented using relatively low-cost components, and (iii) amenable to adaptation, which may be critical in certain high-performance applications.

When implemented in series (i.e., either amplitude before phase or vice versa), the RF output signal from the first pre-distortion circuits forms the RF input signal for the second pre-distortion circuit, where the RF output signal from the second pre-distortion circuit represents the amplitude-and-phase pre-distorted signal that may be applied to a corresponding (high power) amplifier.

When implemented in parallel, the circuits can share the same tap, delay element, and envelope detector circuitry, where the envelope-detected signal drives four non-linear transfer curve circuit paths, analogous to those of circuits 324 and 328 of FIG. 3 and circuits 424 and 428 of FIG. 4. The results are combined in appropriate pairs and used to drive a series combination of an attenuator (analogous to attenuator 306 of FIG. 3) and a phase adjuster (analogous to phase adjuster 406 of FIG. 4) to yield a complex, pre-distorted output signal.

Depending on the implementation, the circuit paths corresponding to non-linear circuits 324 and 424 can also share the same DC-level-shifting circuit, whose output is then split for application to the different amplitude and phase transfer function circuits. Moreover, depending on the actual shapes of the amplitude and phase transfer functions, it may also be possible to share one or more non-linear circuits. For example, the transfer function of first non-linear circuit 324 of FIG. 3 and the transfer function of first non-linear circuit 424 of FIG. 4 appear to have similar shapes. If the differences are sufficiently small for a particular application, a single non-linear circuit could be used for both the amplitude and phase pre-distortion processing, with two different copies of the resulting waveform being applied to two different summation nodes, one for amplitude pre-distortion and the other for phase pre-distortion.

Each of non-linear analog circuits 324, 328, 424, and 428 may be implemented using a piece-wise linear approximation of the transfer curve or a non-linear functional element yielding the desired curve (e.g., a diode or several diodes in series or a transistor with a desirable turn-on characteristic).

Figure 5:
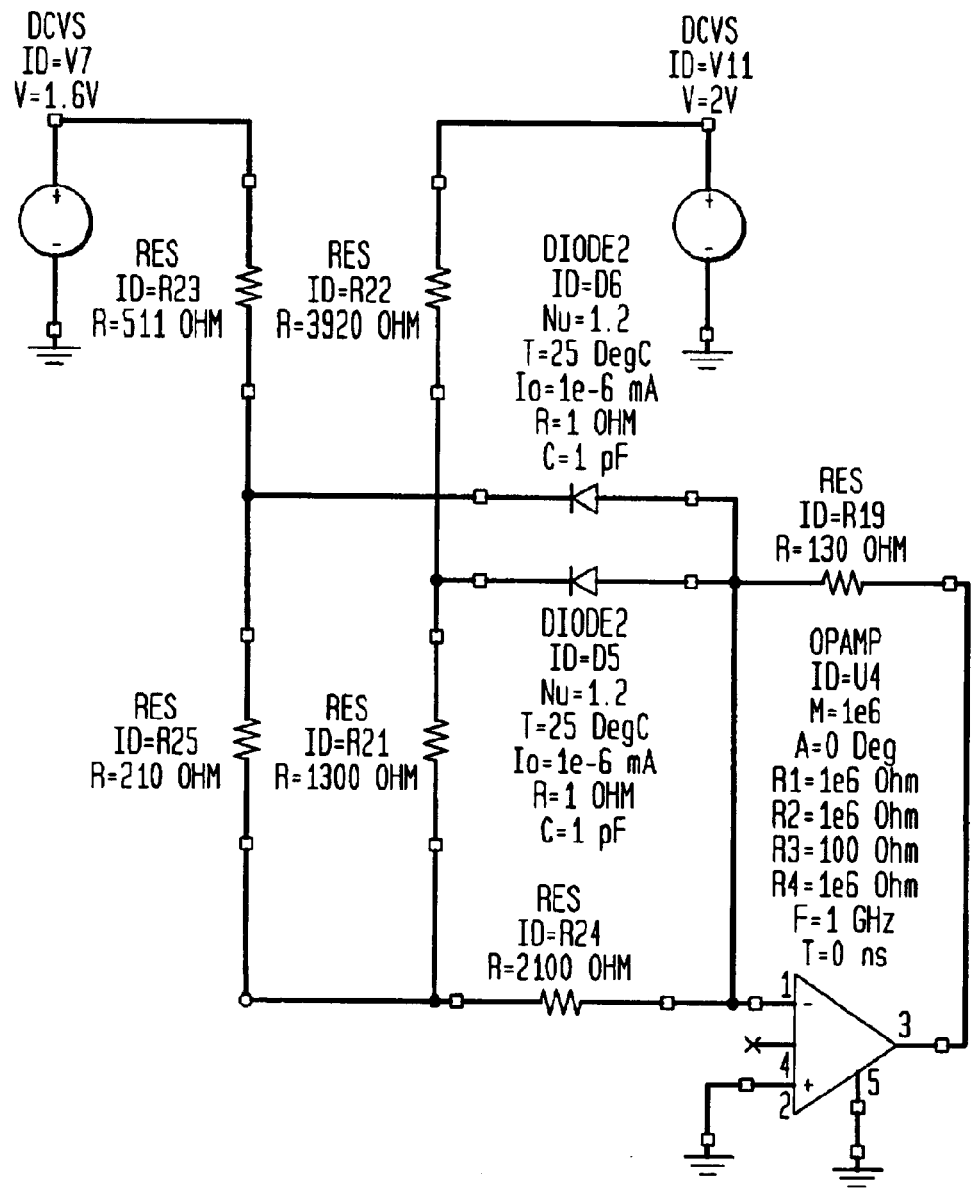
Figure 6:
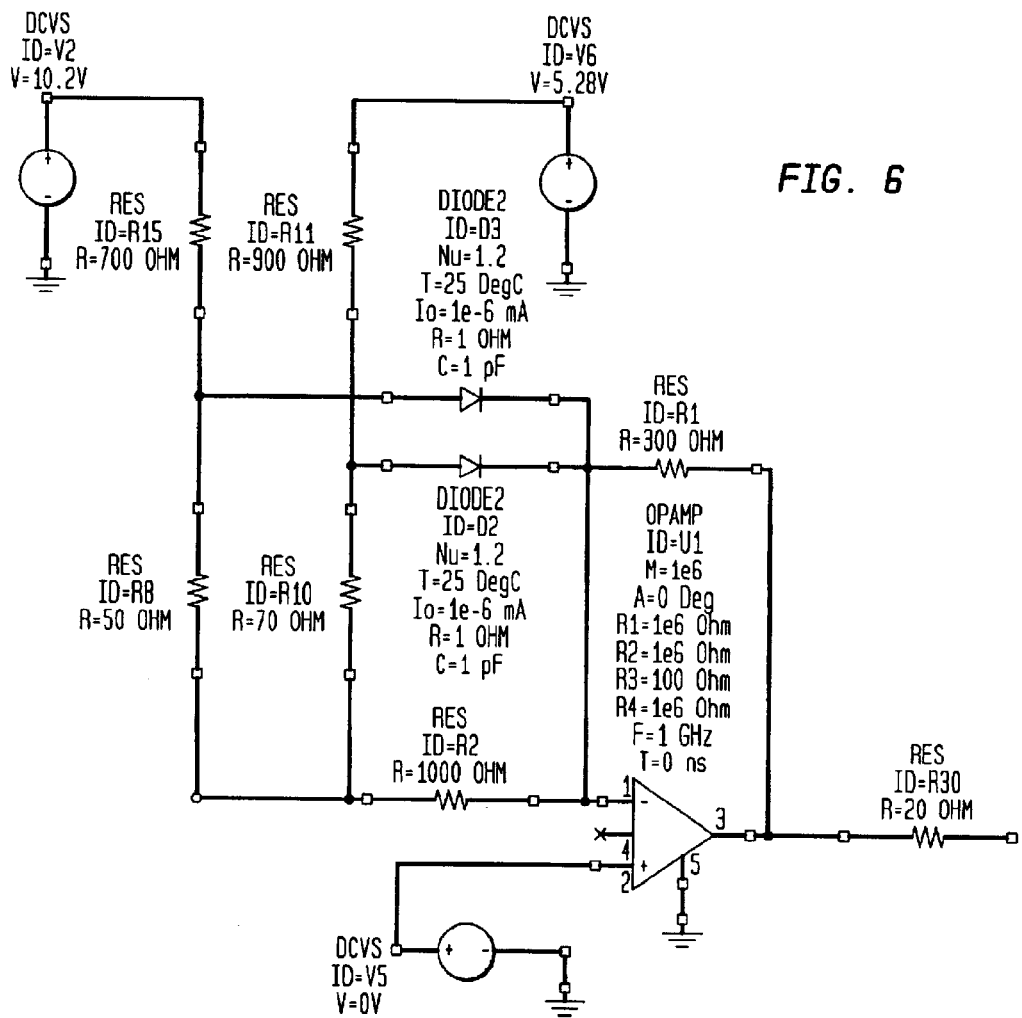
FIG. 6 shows a schematic diagram of a non-linear circuit designed for fourth-quadrant operations.

FIG. 5 shows a schematic diagram of a non-linear circuit designed for second-quadrant operations that could be used for non-linear circuits 324 and 424, while FIG. 6 shows a schematic diagram of a non-linear circuit designed for fourth-quadrant operations that could be used for non-linear circuits 328 and 428.

Frequency-dependent Embodiments

The embodiments of the present invention shown in FIGS. 3 and 4 correspond to frequency-independent pre-distorters (referred to herein as "layer 1" pre-distortion). The concept of the present invention can be extended such that differentiation is applied to the pre-distorted signal to produce a pre-distorted signal that is dependent on frequency (referred to herein as "layer 2" pre-distortion). The differentiated, layer 2 pre-distorted signal is combined with the original, layer 1 pre-distorted signal to produce a pre-distorted signal having both frequency-independent and frequency-dependent characteristics. The "memory effects" prevalent in most class AB amplifiers can be modeled or approximated by a differentiator circuit, which has frequency-dependent amplitude and phase characteristics.

Figure 7:
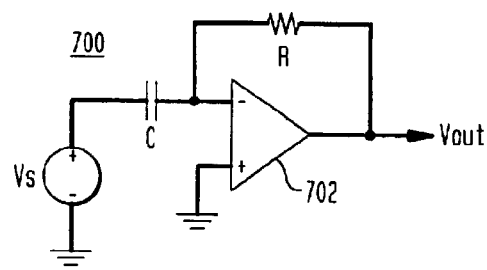
FIG. 7 shows a schematic diagram of a common differentiator circuit implemented using an op-amp.

FIG. 7 shows a schematic diagram of a common differentiator circuit 700 implemented using an op-amp 702. In circuit 700, the output voltage Vout is related to the input voltage Vs according to Vout=−RC d/dt{Vs}. This is equivalent to stating that the gain Gs is −jωRC, where ω is the angular frequency equal to 2πf. These relationships indicate the frequency-dependent and signal-inversion characteristics of the circuit as well as its gain of zero at zero frequency.

Figure 8:
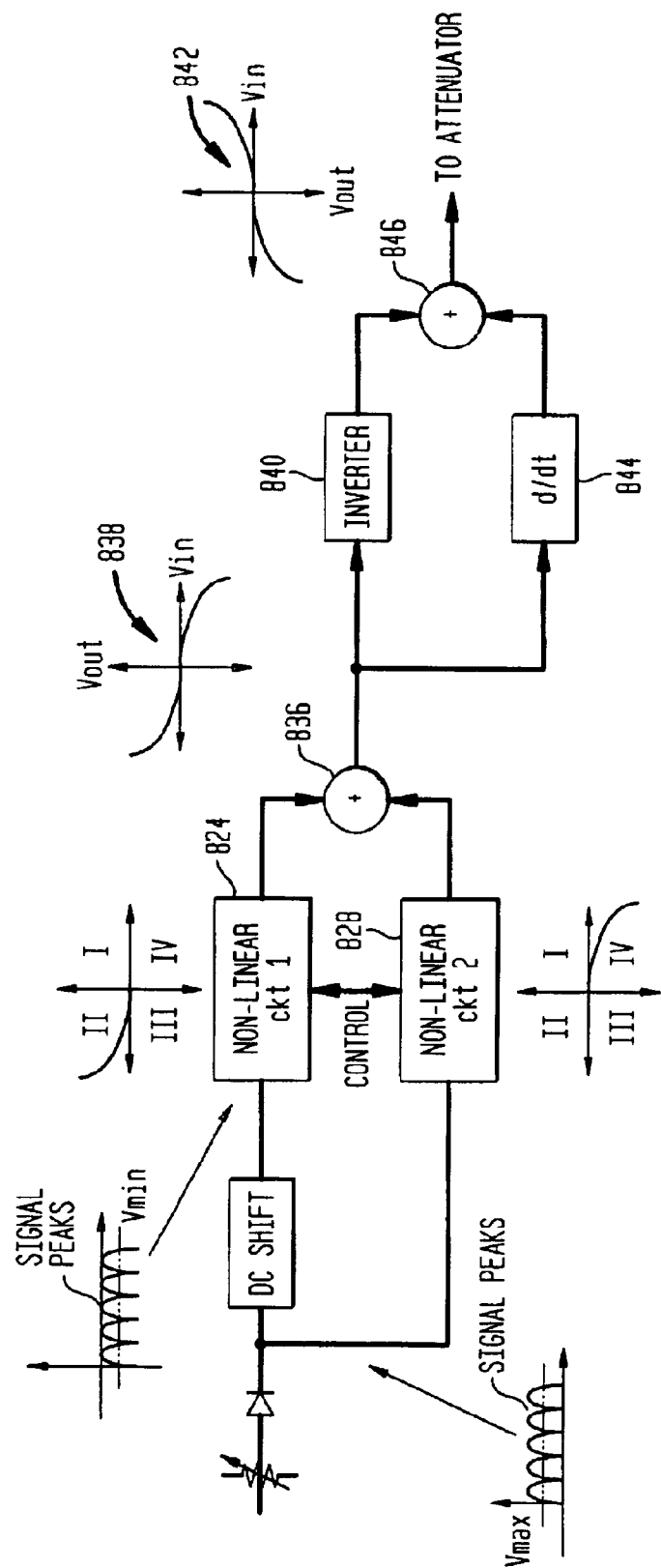
FIG. 8 shows a block diagram illustrating frequency-dependent amplitude pre-distortion of an input signal, according to one embodiment of the present invention.

FIG. 8 shows a block diagram illustrating frequency-dependent amplitude pre-distortion of an input signal, according to one embodiment of the present invention. The pre-distortion processing of FIG. 8 is similar to that of FIG. 3, except that, in addition to inverter 840 (which is analogous to inverter 340 of FIG. 3), FIG. 8 has an inverting differentiator 844 and a summation node 846. As shown in FIG. 8, in addition to being applied to inverter 840, the combined waveform 838 is applied to inverting differentiator 844, which may be based on differentiator circuit 700 of FIG. 7. The resulting inverted waveform from inverter 840 and the resulting inverted and differentiated waveform from differentiator 844 are combined at summation node 846 to form a combined waveform 842, which is applied to an attenuator analogous to attenuator 306 of FIG. 3 to generate a pre-distorted signal for subsequent amplification. In this embodiment, the two non-linear circuits 824 and 828 are each used for both the frequency-independent and the frequency-dependent components, thereby conserving circuitry.

Figure 9:
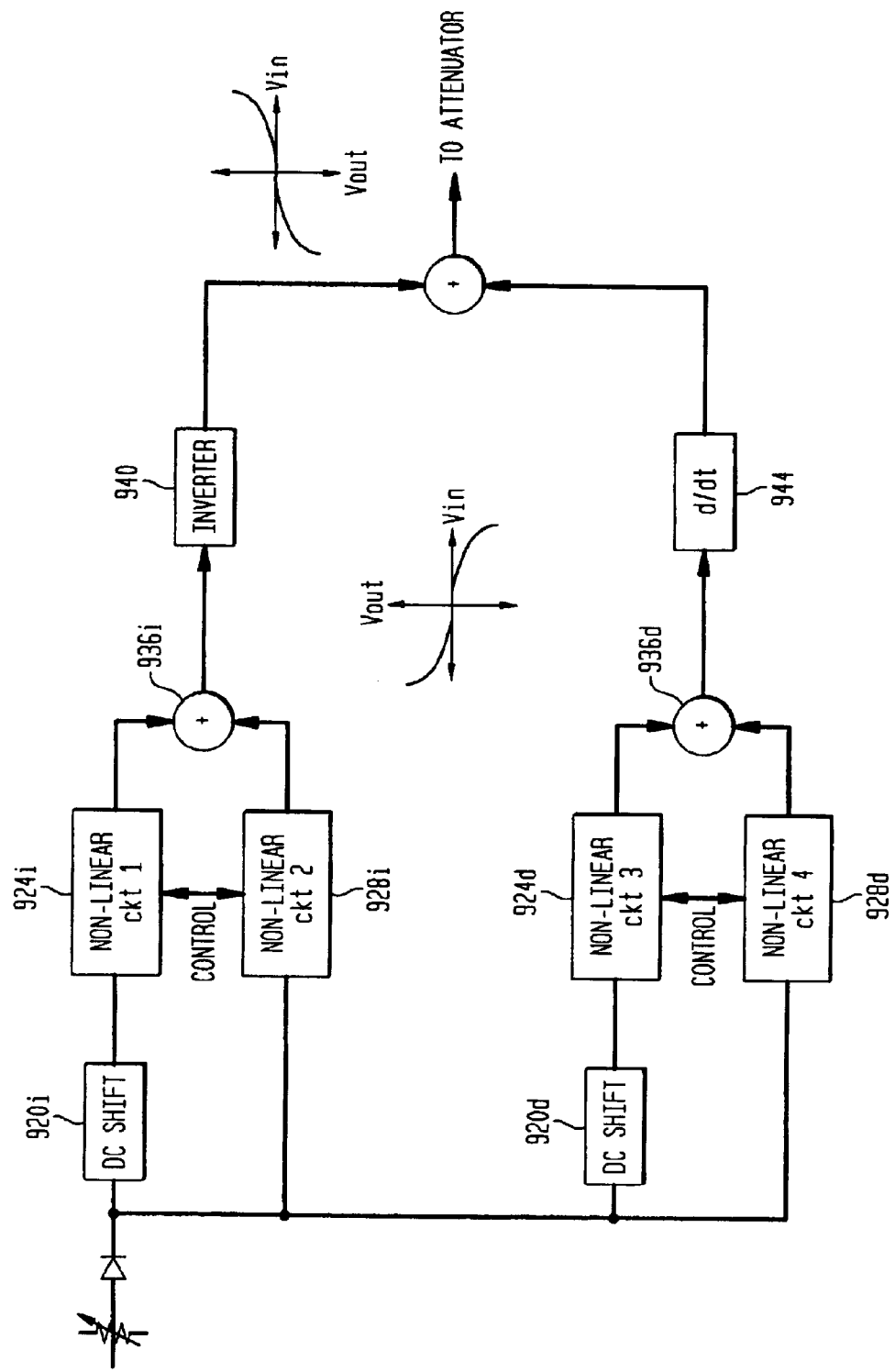
FIG. 9 shows a block diagram illustrating frequency-dependent amplitude pre-distortion of an input signal, according to another embodiment of the present invention.

FIG. 9 shows a block diagram illustrating frequency-dependent amplitude pre-distortion of an input signal, according to another embodiment of the present invention. The pre-distortion processing of FIG. 9 is similar to that of FIG. 8, except that, in FIG. 9, separate circuitry is provided for generating the frequency-independent and the frequency-dependent components, thereby increasing the flexibility of this pre-distortion processing. In particular, FIG. 9 shows two DC shifters 920i and 920d, two second-quadrant non-linear circuits 924i and 924d, two fourth-quadrant non-linear circuits 928i and 928d, and two summation nodes 936i and 936d, where the suffix "i" identifies a frequency-independent component and the suffix "d" identifies a frequency-dependent component. As such, inverter 940 and inverting differentiator 944 receive two potentially different, combined waveforms, respectively, the former corresponding to frequency-independent characteristics and the latter corresponding to frequency-dependent characteristics.

By extension and analogous to FIG. 8, frequency-dependent components can also be added to the frequency-independent phase pre-distortion processing of FIG. 4. In particular, and referring to FIG. 4, after summation node 436, a splitter can be added followed (in one of the splitter's downstream paths) by either a non-inverting differentiator or a combination of an inverting differentiator and an inverter, to generate a non-inverted, differentiated (i.e., frequency-dependent) pre-distortion signal that is then added to the original, frequency-independent waveform 442 to form a combined waveform having both frequency-independent and frequency-dependent characteristics. Alternatively, a second set of frequency-dependent circuitry could be added analogous to FIG. 9.

Alternative Embodiments

The present invention has been described in the context of non-linear circuits that operate in quadrants II and IV (e.g., circuits 324 and 328 of FIG. 3 and circuits 424 and 428 of FIG. 4). This corresponds to preferred implementations in which inverting op-amp circuits, which always operate in quadrant II or IV, are used to keep the gain less than one. In theory, however, the present invention could be implemented using one or more non-linear circuits that operate in either quadrant I or III. Depending on the implementation details, such embodiments might or might not need inverters analogous to inverters 340 of FIG. 3 and 432 of FIG. 4.

Although the present invention has been described in the context of pre-distortion of an LDMOS-based class AB power amplifier, the invention is not so limited. In general, the present invention can be implemented to pre-distort signals input to any type of amplifier exhibiting suitable compression characteristics.

Although the present invention has been described in the context of amplitude and phase pre-distortion processing in which an input signal is decomposed and used to generate two different halves of each transfer function, the invention is not so limited. In general, the present invention can be implemented to model two or more different portions of the amplitude and/or phase transfer functions of an amplifier to be linearized.

The present invention may be implemented in the context of wireless signals transmitted from a base station to one or more mobile units of a wireless communication network. In theory, embodiments of the present invention could be implemented for wireless signals transmitted from a mobile unit to one or more base stations. The present invention can also be implemented in the context of other wireless and even wired communication networks to reduce spurious emissions.

Embodiments of the present invention may be implemented as circuit-based processes, including possible implementation on a single integrated circuit (such as an ASIC or an FPGA), a multi-chip module, a single card, or a multi-card circuit pack.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method for pre-distorting an input signal, comprising:

generating, based on the input signal, a first signal corresponding to a first portion of a first transfer function, wherein the first portion of the first transfer function corresponds to a first voltage range of the input signal;

generating, based on the input signal, a second signal corresponding to a second portion of the first transfer function, wherein the second portion of the first transfer function corresponds to a second voltage range of the input signal different from the first voltage range of the input signal;

combining the first and second signals to generate a first combined signal corresponding to the first transfer function; and pre-distorting the input signal based on the first combined signal.

2. The invention of claim 1, wherein:

the first transfer function corresponds to amplitude characteristics of an amplifier; and the amplitude of the input signal is adjusted based on the first combined signal.

3. The invention of claim 1, wherein:

the first transfer function corresponds to phase characteristics of an amplifier; and the phase of the input signal is adjusted based on the first combined signal.

4. The invention of claim 3, further comprising:

generating, based on the input signal, a third signal corresponding to a first portion of a second transfer function corresponding to amplitude characteristics of the amplifier;

generating, based on the input signal, a fourth signal corresponding to a second portion of the second transfer function;

combining the third and fourth signals to generate a second combined signal corresponding to the second transfer function; and adjusting the amplitude of the input signal based on the second combined signal.

5. The invention of claim 4, further comprising detecting the envelope of the input signal, wherein:

the first and second signals are generated based on the envelope-detected input signal;

the first signal is generated by DC-shifting the envelope-detected input signal; and the first and second signals are generated using different non-linear analog circuits that model different portions of the first transfer function.

6. The invention of claim 1, further comprising detecting the envelope of the input signal, wherein the first and second signals are generated based on the envelope-detected input signal.

7. The invention of claim 6, wherein the first signal is generated by DC-shifting the envelope-detected input signal.

8. The invention of claim 1, wherein the first and second signals are generated using different non-linear analog circuits that model different portions of the first transfer function.

9. The invention of claim 1, further comprising:

differentiating a first portion of the first combined signal to generate a differentiated signal; and combining the differentiated signal with a second portion of the first combined signal to generate a frequency-dependent combined signal, wherein the input signal is pre-distorted based on the frequency-dependent combined signal.

10. The invention of claim 1, further comprising:

generating a frequency-dependent pre-distortion signal; and combining the frequency-dependent pre-distortion signal with the first combined signal to generate a frequency-dependent combined signal, wherein the input signal is pre-distorted based on the frequency-dependent combined signal.

11. An apparatus for pre-distorting an input signal, comprising:

means for generating, based on the input signal, a first signal corresponding to a first portion of a first transfer function, wherein the first portion of the first transfer function corresponds to a first voltage range of the input signal;

means for generating, based on the input signal, a second signal corresponding to a second portion of the first transfer function, wherein the second portion of the first transfer function corresponds to a second voltage range of the input signal different from the first voltage range of the input signal;

means for combining the first and second signals to generate a first combined signal corresponding to the first transfer function; and means for pre-distorting the input signal based on the first combined signal.

12. The invention of claim 11, wherein:

the first transfer function corresponds to amplitude characteristics of an amplifier; and the amplitude of the input signal is adjusted based on the first combined signal.

13. The invention of claim 11, wherein:

the first transfer function corresponds to phase characteristics of an amplifier; and the phase of the input signal is adjusted based on the first combined signal.

14. The invention of claim 13, further comprising:

means for generating, based on the input signal, a third signal corresponding to a first portion of a second transfer function corresponding to amplitude characteristics of the amplifier;

means for generating, based on the input signal, a fourth signal corresponding to a second portion of the second transfer function;

means for combining the third and fourth signals to generate a second combined signal corresponding to the second transfer function; and means for adjusting the amplitude of the input signal based on the second combined signal.

15. An apparatus for pre-distorting an input signal, comprising:

a main signal path comprising a first element adapted to pre-distort the input signal based on a first control signal; and a control signal path adapted to generate the first control signal and comprising:

an envelope detector adapted to detect the envelope of the input signal;

a DC-level-shifting circuit adapted to DC-shift a first copy of the envelope-detected input signal;

a first non-linear circuit adapted to generate, based on the DC-shifted, envelope-detected input signal, a first signal corresponding to a first portion of a first transfer function;

a second non-linear circuit adapted to generate, based on a second copy of the envelope-detected input signal, a second signal corresponding to a second portion of the first transfer function; and a first combiner adapted to combine the first and second signals to generate a first combined signal corresponding to the first transfer function, wherein the first control signal is based on the first combined signal.

16. The invention of claim 15, wherein:

the first transfer function corresponds to amplitude characteristics of an amplifier; and the first element is an attenuator adapted to adjust the amplitude of the input signal based on the first control signal.

17. The invention of claim 15, wherein:

the first transfer function corresponds to phase characteristics of an amplifier; and the first element is a phase adjuster adapted to adjust the phase of the input signal based on the first control signal.

18. The invention of claim 17, wherein:

the main signal path further comprises an attenuator adapted to adjust the amplitude of the input signal based on a second control signal; and the control signal path is further adapted to generate the second control signal and further comprises:

a third non-linear circuit adapted to generate, based on the DC-shifted, envelope-detected input signal, a third signal corresponding to a first portion of a second transfer function corresponding to amplitude characteristics of the amplifier;

a fourth non-linear circuit adapted to generate, based on the envelope-detected input signal, a fourth signal corresponding to a second portion of the second transfer function; and a second combiner adapted to combine the third and fourth signals to generate a second combined signal corresponding to the second transfer function, wherein the second control signal is based on the second combined signal.

19. The invention of claim 18, wherein the first and second non-linear circuits are analog circuits.

20. The invention of claim 15, wherein the first and second non-linear circuits are analog circuits.

21. The invention of claim 15, wherein the control signal path further comprises:

a differentiator adapted to differentiate a first portion of the first combined signal to generate a differentiated signal; and a second combiner adapted to combine the differentiated signal with a second portion of the first combined signal to generate a frequency-dependent combined signal, wherein the first control signal is based on the frequency-dependent combined signal.

22. The invention of claim 15, further comprising:

an additional set of circuitry adapted to generate a frequency-dependent pre-distortion signal; and a second combiner adapted to combine the frequency-dependent pre-distortion signal with the first combined signal to generate a frequency-dependent combined signal, wherein the first control signal is based on the frequency-dependent combined signal.

23. A method for pre-distorting an input signal, comprising:

detecting the envelope of the input signal;

generating, by DC-shifting the envelope-detected input signal, a first signal corresponding to a first portion of a first transfer function;

generating, based on the envelope-detected input signal, a second signal corresponding to a second portion of the first transfer function;

combining the first and second signals to generate a first combined signal corresponding to the first transfer function; and pre-distorting the input signal based on the first combined signal.

24. A method for pre-distorting an input signal, comprising:

generating, based on the input signal, a first signal corresponding to a first portion of a first transfer function;

generating, based on the input signal, a second signal corresponding to a second portion of the first transfer function;

combining the first and second signals to generate a first combined signal corresponding to the first transfer function;

differentiating a first portion of the first combined signal to generate a differentiated signal;

combining the differentiated signal with a second portion of the first combined signal to generate a frequency-dependent combined signal; and pre-distorting the input signal based on the frequency-dependent combined signal.

25. A method for pre-distorting an input signal, comprising:

generating, based on the input signal, a first signal corresponding to a first portion of a first transfer function;

generating, based on the input signal, a second signal corresponding to a second portion of the first transfer function;

combining the first and second signals to generate a first combined signal corresponding to the first transfer function;

generating a frequency-dependent pre-distortion signal;

combining the frequency-dependent pre-distortion signal with the first combined signal to generate a frequency-dependent combined signal; and pre-distorting the input signal based on the frequency-dependent combined signal.

* * * * *